United States Patent [19]

Chance et al.

[11] Patent Number: 4,489,364
[45] Date of Patent: Dec. 18, 1984

[54] CHIP CARRIER WITH EMBEDDED ENGINEERING CHANGE LINES WITH SEVERABLE PERIODICALLY SPACED BRIDGING CONNECTORS ON THE CHIP SUPPORTING SURFACE

[75] Inventors: Dudley A. Chance, Danbury, Conn.; Alan Platt, LaGrangeville, N.Y.; Chung W. Ho, Chappaqua, N.Y.; Sudipta K. Ray, Wappingers Falls, N.Y.

[73] Assignee: International Business Machines Corporation, Armonk, N.Y.

[21] Appl. No.: 337,057

[22] Filed: Dec. 31, 1981

[51] Int. Cl.³ .............................................. H05K 1/18
[52] U.S. Cl. .................................. 361/395; 361/409; 361/414; 361/416
[58] Field of Search ............... 174/68.5; 361/395, 409, 361/410, 414, 416

[56] References Cited

U.S. PATENT DOCUMENTS

| 3,564,115 | 2/1971 | Gribble | 361/414 X |
| 3,777,221 | 12/1973 | Tatsuko et al. | 361/414 X |
| 3,803,483 | 4/1974 | Mcmahon | 361/409 X |
| 3,923,359 | 12/1975 | Newsam | 361/414 X |
| 4,150,421 | 4/1979 | Nishihara et al. | 174/68.5 X |
| 4,254,445 | 3/1981 | Ho | 361/403 X |
| 4,302,625 | 11/1981 | Hetherington et al. | 174/68.5 |
| 4,371,744 | 2/1983 | Badet et al. | 361/414 X |

FOREIGN PATENT DOCUMENTS 2305914 10/1976 France ................................ 361/409

OTHER PUBLICATIONS

S. Picard, Printed–Circuit Card Rework Process, IBM Tech. Discl. Bull., vol. 15, No. 1, Jun. 1972, pp. 246 & 247.

Primary Examiner—R. R. Kucia
Attorney, Agent, or Firm—Graham S. Jones, II

[57] ABSTRACT

A chip carrying module includes a number of engineering change lines buried below the surface of the module. The engineering change lines are interrupted periodically to provide a set of vias extending up to the upper surface of the module between each set of chips where the vias are connected by dumbbell-shaped pads including a narrow link which permits laser deletion or the like. In addition, the dumbbell-shaped pads are located adjacent to the fan-out pads for the chips. Thus, the fan-out pads can be connected to the dumbbell-shaped pads by means of fly-wires. In addition, individual engineering change lines can be connected together to reach every region of the module by connecting a fly-wire from one dumbbell-shaped pad to another. In addition, by deleting the links at such dumbbell-shaped pads, the engineering change connections are limited to the particular path required.

6 Claims, 13 Drawing Figures

FIG. 1.1
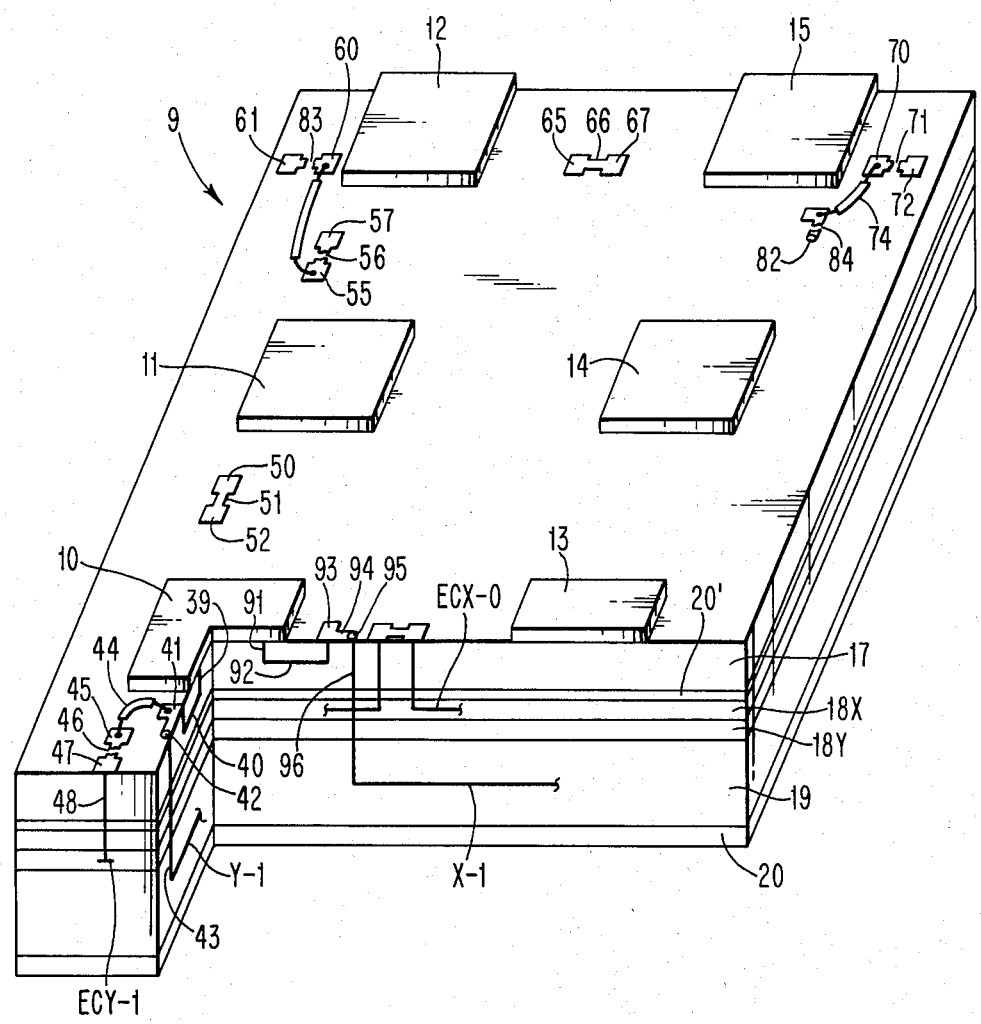

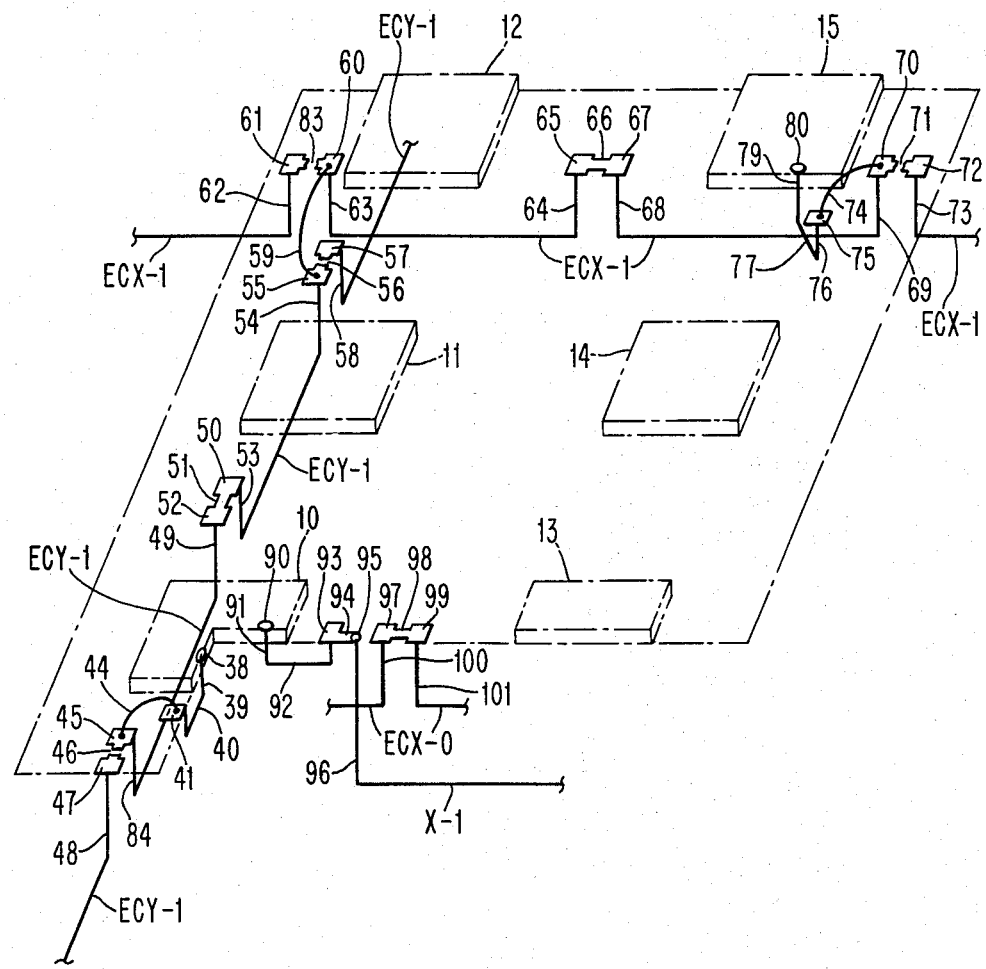
FIG. 1.2

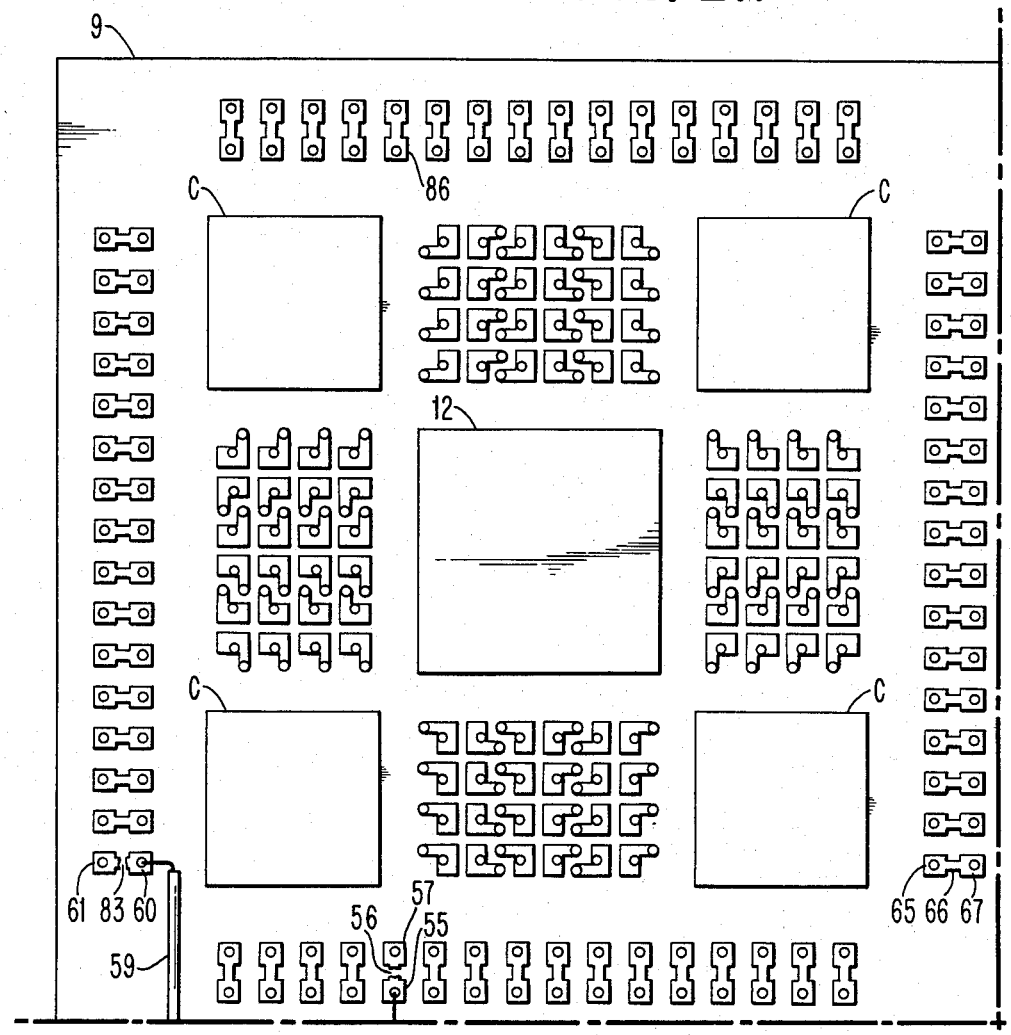

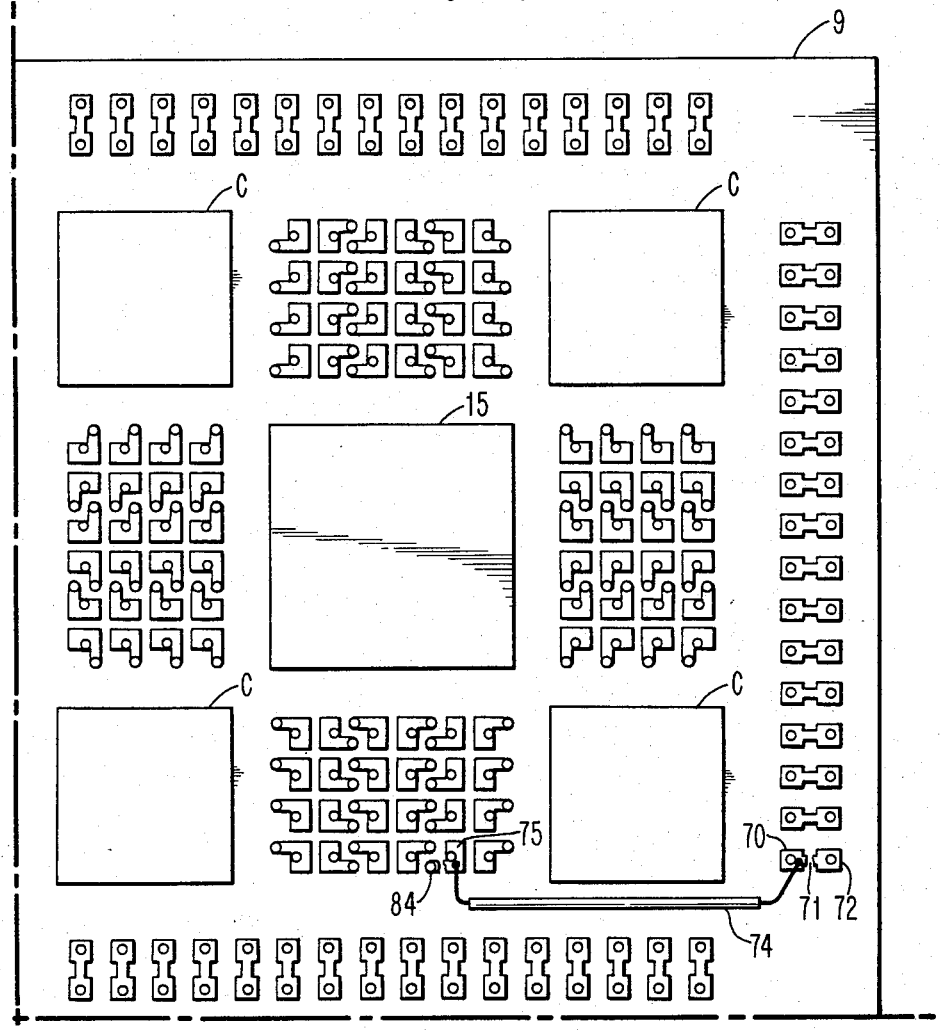
FIG. 2.2

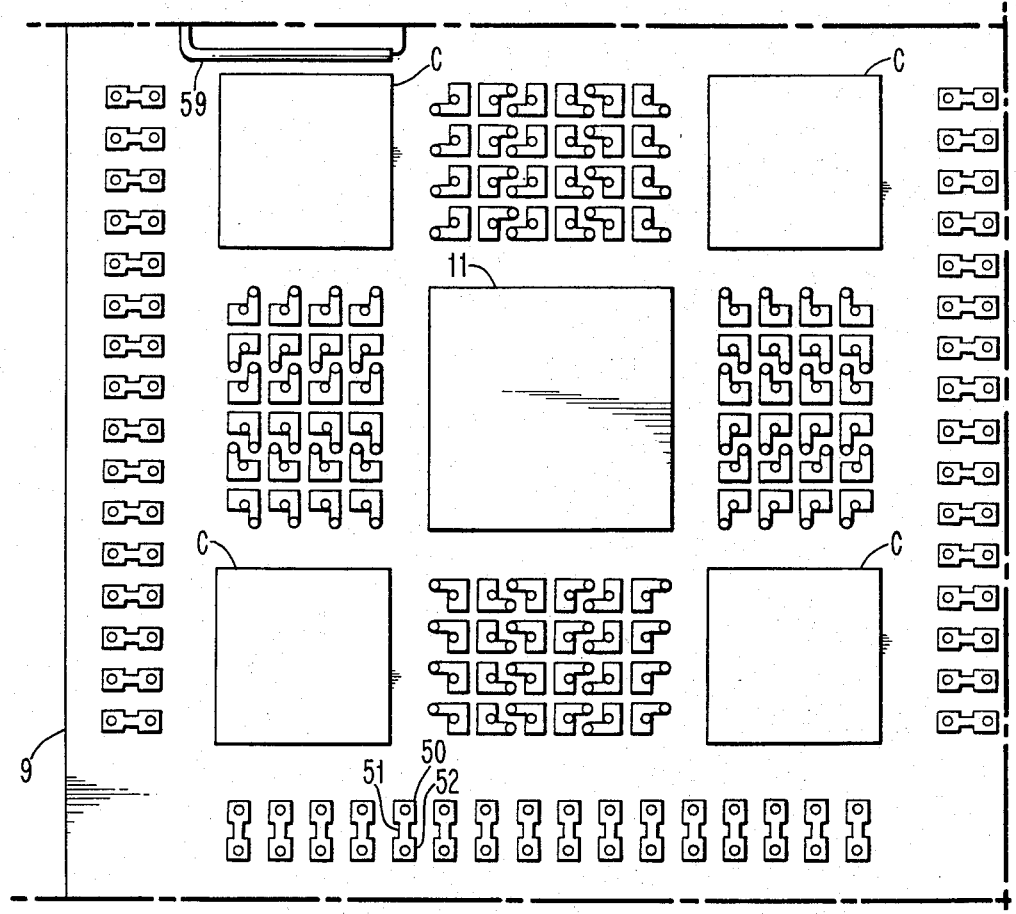
FIG. 2.3

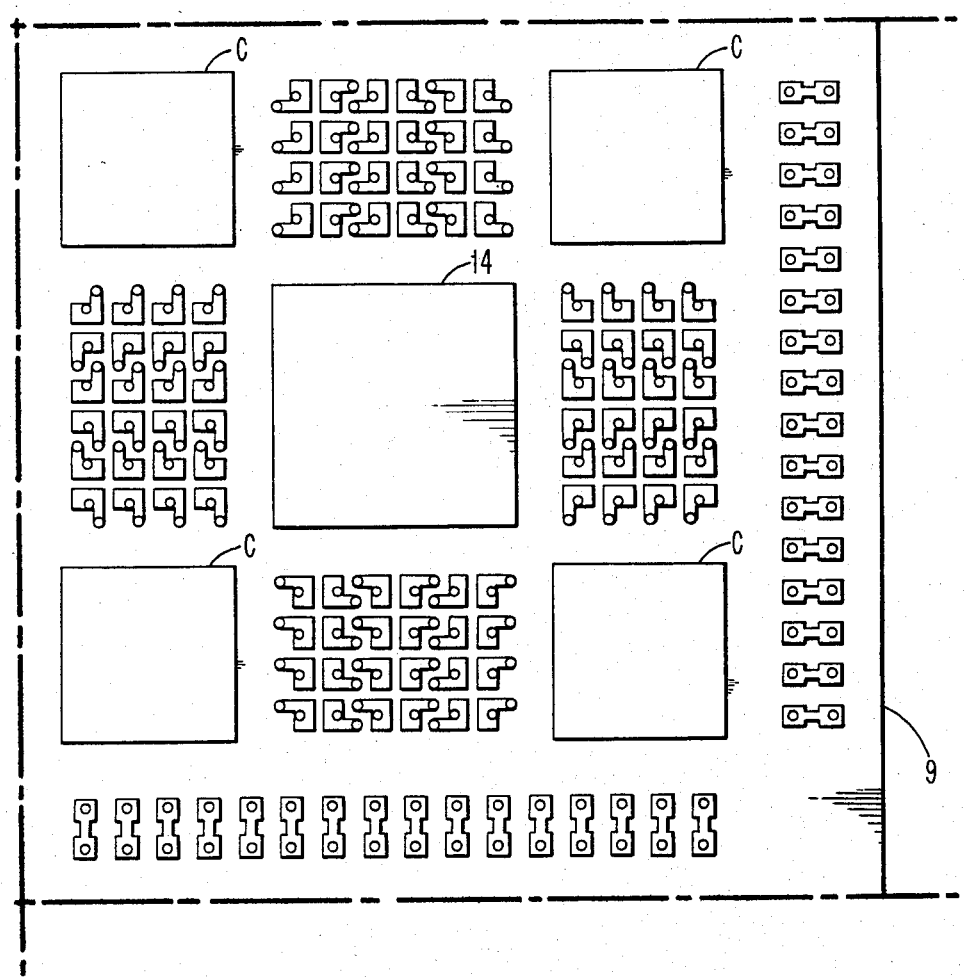
FIG. 2.4

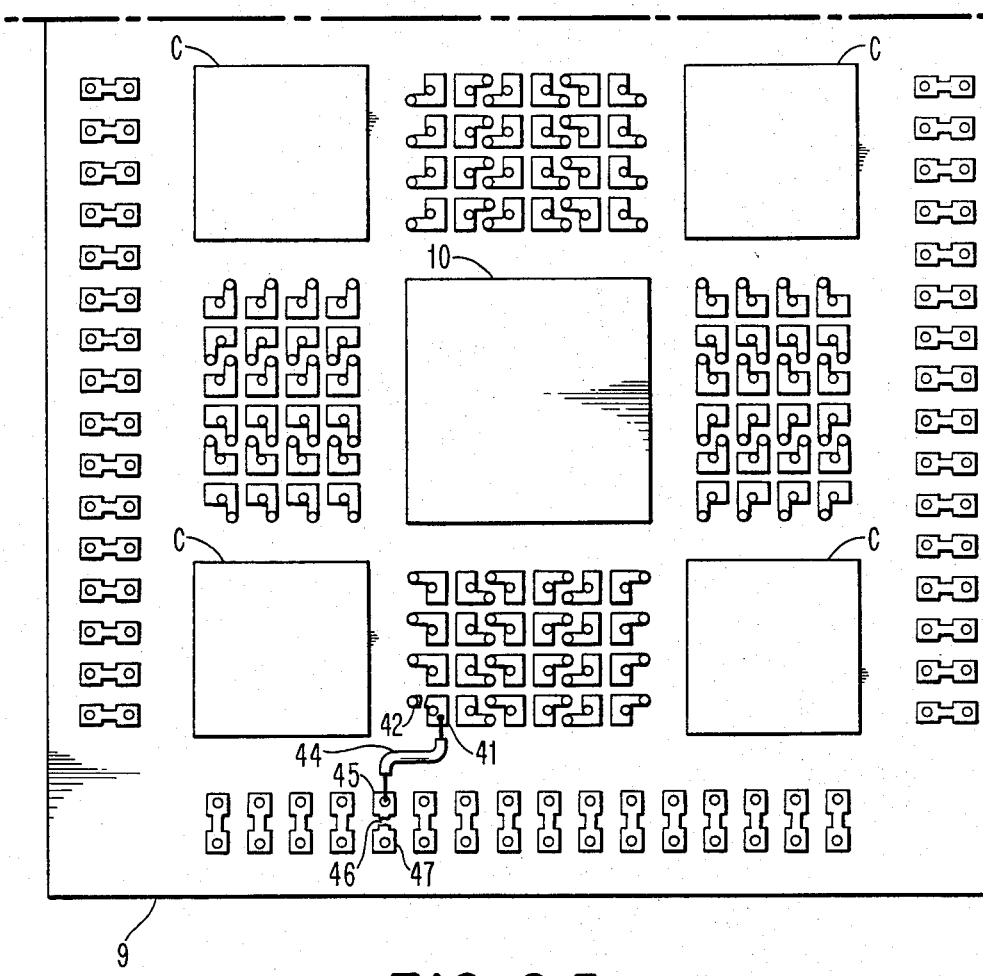
FIG. 2.5

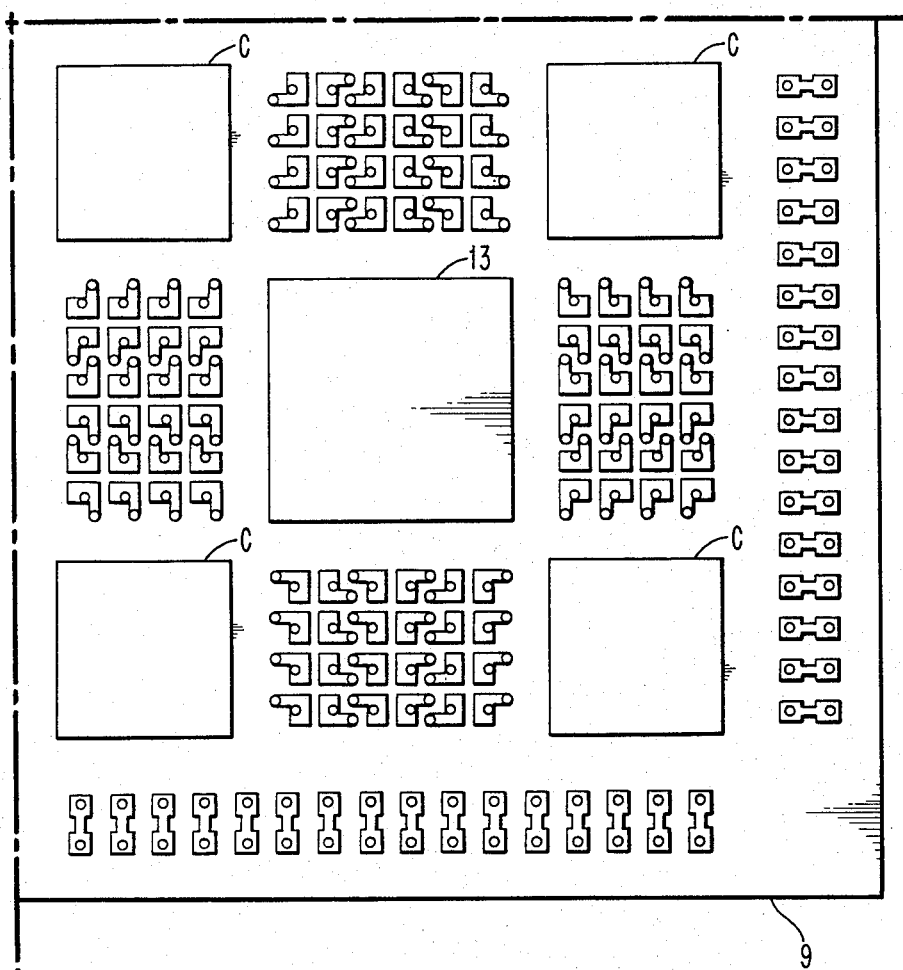
FIG. 2.6

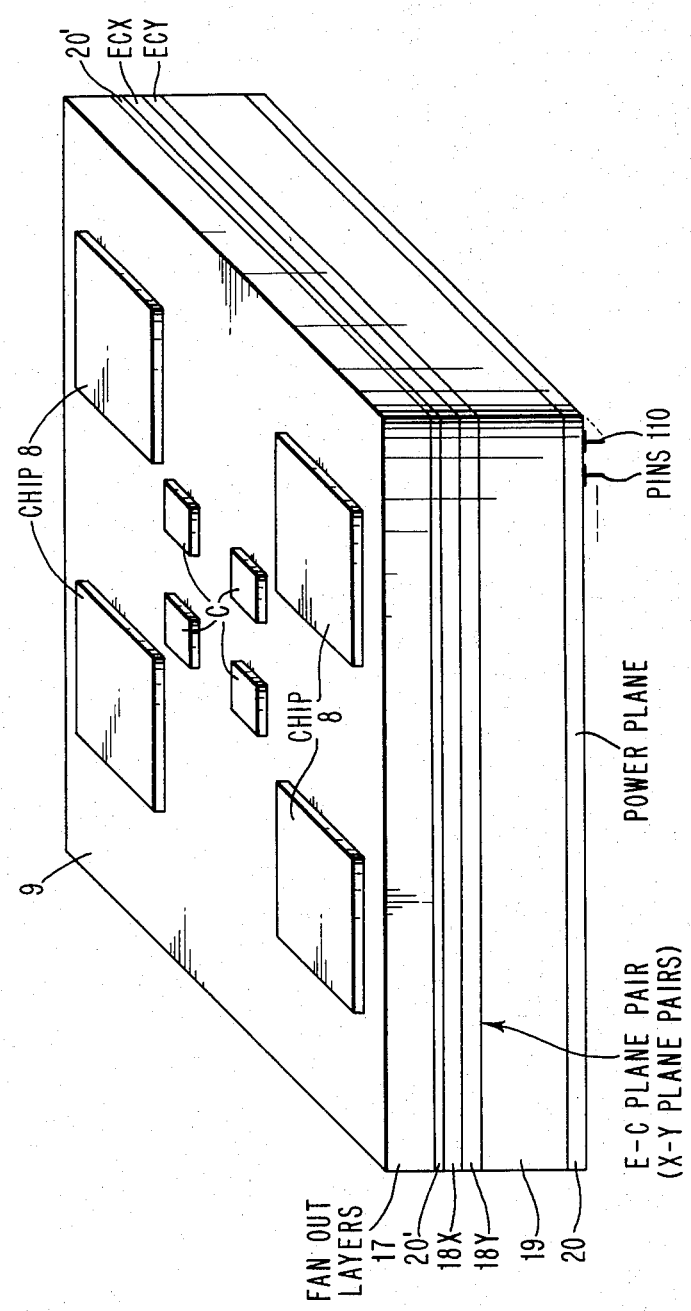

CHIP CARRIER WITH EMBEDDED ENGINEERING CHANGE LINES WITH SEVERABLE PERIODICALLY SPACED BRIDGING CONNECTORS ON THE CHIP SUPPORTING SURFACE

DESCRIPTION

1. Technical Field

This invention relates to integrated circuit chip carriers (known more commonly as packages) on which chips can be bonded for electrical contact and mechanical support, in which permanent electrical interconnections of the circuits of the chip are made and which provide electrical connections to other circuits of a system such as computers and other electrical products. More particularly, this invention relates to the problem of making engineering changes in the chip carriers subsequently to the initiation of the design of the carrier or subsequent to its construction.

2. Background Art

Currently, chips have been designed with hundreds or thousands of individual active devices (transistors) on a single chip. Very large numbers of electrical connections are required to permit communication of signals back and forth from the chips to other chips and to the electronic products which employ the chips. As the carriers suitable for such purposes are extremely complex, especially when they carry as many as several to hundreds of chips of that magnitude, the facility of alteration of the chip carriers or packages becomes minimal. Heretofore, it has been suggested that such alterations known as "engineering change" wiring or deletion should be performed by providing connections on the upper surface of the chip carriers in the form of previously provided engineering change lines or connectors.

I. INTRODUCTION AND CURRENT STATUS ENGINEERING CHANGE(EC)

Engineering change in electronic packaging technology is a process by which the chips and the modules on their carrier can be removed and replaced individually. Furthermore, electrical connection networks in a chip carrier known as a module, card or board can be physically added, deleted or rerouted. The changes are necessary during the development stage of a carrier so that design errors may be corrected and the timing of new or alternate networks tested. Specific techniques are required for deleting a connection from any signal terminal of a chip to the package wiring network and rerouting the terminal to other networks or chip terminals as desired. The very nature of the scheme also provides a means by which repairs are accomplished on defective networks which are located within a carrier. In manufacturing, such a repair scheme is used to enhance yield. The wires used to make new interconnections are called EC wires and the technology for changing the ∓personality" of the permanent interconnection is the EC scheme.

NETWORK MODIFICATIONS ON BOARDS, CARDS AND MODULES

Since the early technology of solid state components, discrete devices were interconnected by etched lines on cards and boards. The devices were sealed in hermetic cans or mounted on ceramic modules which were plugged into and soldered to the cards. On the backside of the cards and also boards to which the cards were perpendicularly mounted, pins were used for electrical testing of wire connections. Modifications of the networks were accomplished by discrete wire straps routed between pins on the back of cards or boards. Connections were made to the circuits by soldering or wirewrapping of the wires to the pins and the permanent lines were deleted by cutting or drilling through the circuit card.

The integration of devices on silicon chips led to increased number of contacts and each chip was generally sealed in a plastic or ceramic module with flying leads or pins. These leads or pins were soldered to pads on a circuit card which interconnects the chips. In an advanced approach for packaging the integrated devices, a multichip ceramic module has been used. The chips were mounted directly to the ceramic substrate by solder balls using the C4 (controlled collapse chip connection) technology. State of the art packaging technology is exemplified by B. T. Clark and Y. M. Hill, "IBM Multichip Multilayer Ceramic Modules for LSI Chips-Design for Performance and Density", IEEE Trans. on CHMT, CHMT-3, 1, 89, 1980; and M. Nishihara et al, U.S. Pat. No. 4,150,421 Apr. 17, 1979. The EC scheme utilized an EC pad (or modification pad) located between the signal terminals of the chip and a via which connects to internal wiring of the ceramic substrate or printed circuit card. All signal terminals are fanned out from under the chip to the modification pads. Surrounding the chip, the connections between the EC pads and the vias to the interconnection wiring of a module or card were made by narrow deletable straps. Modification of a circuit within the substrate or card is made by deleting the deletable strap, then a discrete wire is bonded to the modification pad and routed to a similar modification pad at the other end of the discrete wire. The discrete wire EC scheme until now has been pervasive in the industry.

The dimensions of the wires and pads used on an organic circuit card are several times larger than those of the ceramic module and the joining and deletion techniques differ. For example, mechanical cutting is used on the card and laser evaporation is used on the ceramic module for deletion. For bonding, wires are usually soldered on the organic card but ultrasonically bonded to pads on the ceramic module.

Ho, U.S. Pat. No. 4,254,445, teaches the concept of arranging engineering change lines in an orthogonal and hierarchical array upon the upper surface of a module by means of placing the pads at the ends of the shorter engineering change lines and placing pads on the longer engineering change lines in close proximity to the ends of the shorter lines so that the fly wires are short, have low values of resistance, plus low inductive coupling are less bulky and required little space. That minimizes crowding where there are many such wires. The net result is a new structure.

Jarvela et al "Wireability Enhancement" IBM Technical Disclosure Bulletin, Vol. 11, No. 8, page 3624 (February 1979) shows an MLC structure which illustrates that x, y planes for signals (2) can be stacked upon several different layers. The idea of discretionary vias (5) is stated. While it makes no mention of engineering change lines it is quite possible to utilize such a structure in that way.

Ecker, U.S. Pat. No. 3,277,347, "Electric Circuit Panelboard" shows an x, y panelboard with a buried x-y matrix of conductors adapted to provide a wiring path for components. "An additional object of the present invention is to provide an electrical circuit panelboard in which a circuit layout once selected and made operative may be simply and conveniently altered either radically or to permit installation of additional components so as to balance up the original circuit."

U.S. Pat. No. 4,150,421 of Nishihara et al of Fujitsu Ltd. for "Multi-layer Printed Circuit Board" shows modification of pads and through holes instead of vias. That patent states "The principal object of the invention is to provide a multi-layer printed circuit board which permits alteration of wiring patterns with facility, convenience and ease, even after a multi-lead element such as an LSI is mounted." The changes are made on the upper surface in the fan-out region. At Col. 6, lines 25–41 it is made clear that a buried wire is disconnected from the upper printed circuit board 1 when a cut at the arrow on the surface disconnects a land 9 from the modification pad 7' in FIG. 2.

U.S. Pat. No. 4,136,356 of Kusano of Hitachi Ltd. for a "Wiring Substrate for a Matrix Circuit" shows a technique of burying x-y conductors for wiring of components.

Nishihara U.S. Pat. No. 4,150,421 makes no suggestion of the concept of periodically breaking the x and y lines at uniformly spaced intervals with the lines extending at each break in parallel up to the bridging connectors on the upper surface. The advantage obtained by this invention comprises reducing the number of engineering change lines required by almost an order of magnitude. This invention is totally unsuggested by the prior art available.

In a multi-chip carrier module for supporting chips in a computer, the discrete wire EC scheme used is that previously described. In the design the chip spacing was determined in part by the need for large numbers of EC pads and the channels in which the EC wires are routed from one chip site to the next. For the wire routing process, automatic tools shaped each EC wire for its predetermined route, ends of polyimide coated wire were stripped by an arc and were ultrasonically bonded to the EC pads.

In a multi-chip carrier module, dozens of EC pads per chip are arranged in two rows on each of the four sides of the chip. There are three layers of wiring channels (designated A, B and C) between any two chips in the X or Y direction. Each channel is a fraction of a millimeter wide. The upper and lower channels A and C are partially obstructed by the fan-out straps for laser deletion. Several wires can be included between two chips on one layer that can be placed in the different channels by the automatic wire bonder in several stacked layers of wires.

The EC pad layers consist of Mo/Alumina cermet, Ni and Au and are 0.3 mm×0.3 mm in size.

Engineering Change Cycle

Engineering change in the testing and functional evaluation cycle of the system is carried out to:
(1) replace defective signal lines, or
(2) make new connections correcting design errors or creating new circuit designs.

Several process steps are involved. Following fabrication, DC tests are performed to determine whether or not the substrate is repairable and, if so, the number and location of the repairable lines. A predetermined number of defective lines is set as an acceptable level depending upon substrate production and needs. These defective lines are repaired in order to make the substrate electrically good. The defective connections are replaced by discrete wiring in two process steps:
a. The fan-out line from the EC pad to the internal interconnection via is deleted. The line deletion is done by a pulsed ruby laser. This isolates the terminal from the wiring nets.
b. The corresponding EC pads are connected by a discrete wire. The ultrasonic bonding is done by an automated machine which forms and routs the wire in the proper wiring channels and bond the ends of the wire to pads.

After the completion of EC for repair, the chips are joined to the carrier module by C4 solder balls and the module is sent for functional testing. This is done to check and to improve the operational characteristics of the module. The changes to be made in the existing connections are determined and the module is sent back for engineering change wiring.

Design Changes by EC Wiring

As described above, discrete wires are employed for repair using this process. The number of EC wires per module for a typical engineering change cycle for the system is several dozens. The process of engineering change and functional testing is carried out several times. In each cycle of testing additional changes are made and the total number of discrete wires at the end of the testing cycle may be several hundreds.

The EC connections are made by following these rules:
(1) Shortest available path.
(2) Minimum number of right angle turns.
(3) Availability of EC wiring channels.

II. ENGINEERING CHANGE REQUIREMENTS FOR FURTURE HIGH PERFORMANCE MODULES

In previous sections, we reviewed the fundamentals of EC technology of a prior art EC scheme and some of the engineering experiences obtained. In the future, significant performance and density enhancements will be implemented. Logic and cache chips will change in terms of the speed and number of circuits on a chip, the number of I/O's for each chip, the rise time of the off chip drivers, etc. Likewise more stringent electrical and physical requirements will be placed on the carrier module to support the chips. Many more total signal I/O's on each module will have to be interconnected, hence more module wiring and more EC wires will be needed on a module. The other major problem for discrete EC wires on a module in future module applications is the extent of electrically coupled noises. In an EC wiring channel, up to three EC wires can be placed horizontally in a channel to form a layer and there are up to 4 layers in a given channel.

In one system, the DC noise margin for the receiver circuit is 260 mv. For the signal lines buried in the ceramic substrate, the design assigns 80 mv for the coupled noise. Using the discrete EC wiring scheme, however, it is difficult to design the coupled noise to maintain the 80 mv level, when current EC wiring rules are actually being developed to keep the coupled noise within 300 mv. In case the total noise exceeds the noise margin of the receiver circuit, the EC wires do have the flexibility to be rerouted.

For a more advanced system, the coupled noises for discrete EC wires are higher than the case for another. This is true primarily because of a faster off-chip driver rise time and a longer coupled line length required by a greater chip pitch dictated by a density of circuits on the chip. These two items give a total combined factor, F, of a little less than two.

In addition, the fan-out layers for the more advanced system will contribute to more noises than those of previous systems because of more couplings in both the horizontal and vertical dimensions. The total weighted noises in the discrete EC wire would therefore approach an average factor of 2 higher than for the previous system for the same number of chip pitches. The present EC wiring rules would result in a maximum noise close to 600 mv which is clearly unacceptable. The coupled noises would be even higher for future systems beyond those described here. These concerns have motivated development of an alternative EC scheme which is capable of reducing the amount of coupled noises for the future advanced systems. An integrated EC scheme, utilizing redundancy in the module wiring, has been proposed and will now be presented in the following section.

III. INTEGRATED EC TECHNOLOGY FOR FUTURE HIGH PERFORMANCE MODULES

It was shown in the previous section that future systems require the reduction of coupled noise between EC wires to the extent that discrete wires are no longer viable. The coupling problem becomes very significant when discrete wires are run parallel to each other for distances of more than 1 to 2 cm. Several expensive discrete wire solutions to this problem, e.g., twisted pair, tri-lead, coaxial wires etc. have been proposed. All these solutions have unique problems such as forming and bending, making more than two bonds per wire, determining whether a ground lead is well bonded electrically, need for wide channels, desoldering and unbundling of bundled coaxial wires, etc. In the present integrated EC scheme, neither expensive discrete wires nor forming and bending schemes ae necessary thereby allowing the use of tools currently in use.

BRIEF DESCRIPTION OF THE DRAWINGS

FIG. 1.1 shows a perspective view of a chip carrier with a number of chips affixed thereto by means of solder ball connections and with several layers of circuitry for connection of the solder balls to power and signal lines including engineering change circuits in accordance with this invention.

FIG. 1.2 shows a similar view to FIG. 1.1 with the engineering change lines completely exposed with only the phantom shapes of the chips shown in order that the novel pattern of a few of the engineering change lies can be seen more clearly.

FIG. 2 is a chart which shows how to assemble FIGS. 2.1–2.6.

FIGS. 2.1 to 2.6 are plan views of the detailed circuit shown in FIG. 1.1, with all of the fan-out patterns, the capacitors and the engineering change line links shown on the surface of the carrier, surrounding the chips.

FIG. 3 is a similar view to FIG. 1.1 with the arrangement of the chips and the laminated layers of the fan-out, the engineering change layers, the x-y pair of planes of signal connection lines, power distribution plane layers connecting power to the chips from the capacitors and the pins shown below, with the pins also connected to the x-y lines when appropriate.

DESCRIPTION OF THE PREFERRED EMBODIMENT

Figure 4:
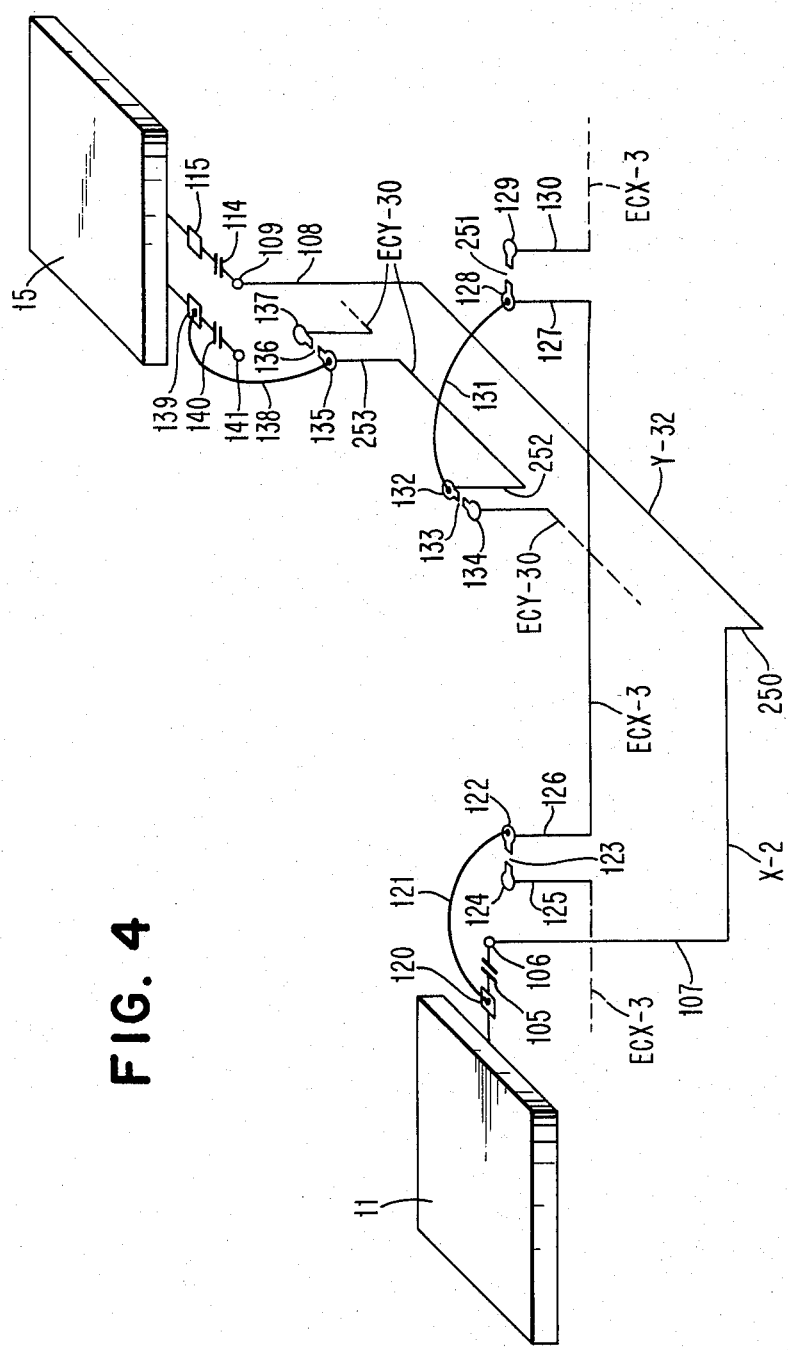
FIG. 4 is a similar view to FIG. 1.2 which illustrates connections between two chips through the x-y lines being replaced by connections through the engineering change lines.

FIG. 1.1 shows a perspective view of a chip carrier 9 with an array of chips 10–15 supported on the carrier 9 by means of solder ball joints (not shown) employing the conventional C-4 solder ball technology. In this case, a C-4 joint of chip 10 is connected to a C-4 joint of chip 15 by means of the novel engineering change structure of the instant invention. The arrays of engineering change lines ECX and ECY (in the x and y directions) are buried in the dielectric material comprising the matrix of the carrier 9, preferably a ceramic material. A few of a large array of the buried engineering change lines ECX-0, ECX-1, and ECY-1 can be seen in FIG. 1.2 which shows those conductors in the carrier 9 for the purpose of illustrating the structure employed for implementing engineering changes in accordance with this invention. Of the layers comprising the carrier 9, the uppermost one is the fan-out metallization layer 17 which involves the connections from the C-4 joints to the pads 93 which (although only one is shown in FIG. 1.1) surround the chips 10 with thin film metallic connections 94 to pads 95. Pads 95 connect by vias 96 to original interconnection lines such as x-1 in the X and Y directions in layer 19. Between layers 17 and 19 are a power distribution layer 20' and the engineering change EC layer 18 which includes an upper portion 18X for the parallel array of ECX lines such as EXC-0 and a lower portion 18Y for the parallel array of ECY lines such as ECY-1. At the very base is another layer 20 of power conductors providing the power supply.

Referring to FIG. 1.1 and more particularly to FIG. 1.2 which shows C-4's not seen in FIG. 1.1, assume that C-4 90 of chip 10 is connected to a circuit which is required to be disconnected from its load. On the other hand C-4 38 of chip 10 is connected to a circuit which must be connected to a circuit in chip 15 which is connected to C-4 80, but which is not connected to any other circuit. The problem is to connect an engineering change line from pad 41 (attached to C-4 38 via 39 and fan-out line 40 and its via) to pad 75 (attached to C-4 80 by via 76 lines 77 and 78 and via 79).

Solder ball 90 is connected to via 91 which connects to fan-out layer conductor 92 which connects to the via to pad 93 which is connected by bridge 94 to pad 95 which connects by via 96 to the x-y conductor X-1 in layer 19 providing connection to the load of C-4 90 which is not shown for convenience of illustration. The bridge 94 of a thin film of metal is cut by means of a laser deletion or the like to break the connection.

The new connection of C-4 38 to C-4 80 is performed by connecting contact pad 41 from the fan-out for C-4 38 to pad 45 of a dumbbell-shaped link composed of a set of contact pads 45 and 47 connected by a narrower bridge 46 of metal. The link 45-46-47 is provided to serve as a severable bridging connector in an engineering change line ECY-1. In this case, bridge 46 has been cut to disconnect pad 47, via 48 and the lower extension of engineering change line ECY-1 from the pad 45. Pad 45 is connected by via 84 to the upper extension of engineering change line ECY-1 up to via 49 which is connected to pad 52 of a dumbbell pattern 50-51-52 of pad 50, bridge 51 and pad 52. Metal conductors 50, 51 and 52 are on the upper surface of the carrier 9. Pad 50 is connected to the next segment of engineering change line ECY-1 by means of via 53. Via 54 is connected to the other end of that segment of line ECY-1 to pad 55 of a dumbbell-shaped bridging connector 55-56-57 composed of pad 55, bridge 56 (which has been broken by laser deletion or the like) and pad 57 which is connected by via 58 to the last section of engineering change line ECY-1 shown in FIG. 1.2.

It should be noted that the metallic engineering change line ECY-1 is discontinuous with the metallic dumbbell-shaped links 45-46-47, 50-51-52, and 55-56-57 and their associated metallic vias 48, 84, 49, 53, 54 and 58 completing the original engineering change line ECY-1 which is composed of long lengths of lines buried in the dielectric matrix of the carrier 9 with a desirable characteristic impedance which minimizes reflections because of the matched characteristic impedance, and the short lengths of the vias and the dumbbell-shaped links having minimal effect upon the transmission line characteristics because of their extremely short lengths, relative to the buried lengths of line ECY-1. Engineering change lines ECX-0 and ECX-1 are also shown in FIG. 1.2. It should be understood that in one preferred embodiment there is an array of sixteen such engineering change lines under each of the chips 10, 11, 12, 13, 14 and 15 extending in each of the x and y directions in the engineering change layers 18X and 18Y, as illustrated by the dumbbell-shaped patterns in FIGS. 2.1 to 2.6 with sixteen sets of dumbbell-shaped engineering change links on the periphery of the fan-out pattern for each of the chips 10-15. In FIG. 1.2, only three of such lines ECY-1, ECX-0 and ECX-1 are illustrated for the purpose of facilitating understanding of the scheme of connection of all of the EC lines by illustrating the connections of a few, without the confusion which would exist if the 48 ECX and 48 ECY lines were shown in the portion of carrier 9 included in FIG. 1.2.

Pad 55 on the surface of the carrier 9 is connected by fly-wire 59 to an adjacent pad 60 of a dumbbell-shaped link 60-83-61 with the link broken by laser deletion of bridge 83. Pad 61, which is excluded from the ultimate EC line structure being constructed here, is connected by via 62 to the unused left end of line ECX-1. Pad 60 is connected by via 63 to the right branch of line ECX-1 which connects next to via 64 to pad 65, bridge 66 to pad 67 of a dumbbell-shaped link 65-66-67. Pad 67 is connected by via 68 down to the next segment of the ECX-1 line which extends to via 69 which surfaces in contact with pad 70 of link 70-71-72, in which bridge 71 is broken by laser deletion as pad 70 is the end of the portion of ECX-1 line being used.

Pad 72 is connected to via 73 which connects to the unused extension of ECX-1. Pad 70 is connected to pad 75 of the fan-out of chip 15 by means of fly-wire 74. Pad 75 is connected by via 76 to line 77 in the fan-out level to via 79 to the C-4 80 of chip 15 which is the connection to be made from C-4 38 of chip 10. Details are illustrated in FIGS. 2.1 to 2.6., which is a plan view of the top surface of the carrier 9 of FIG. 1.1. The EC lines ECY-1 and ECX-1 are shown in dotted line form.

FIG. 3 shows the carrier 9 of FIG. 1.1 with the chips 8 and capacitors C on the top surface of the carrier. Fan-out layer 17 is the top layer of the carrier 9. Next comes the power plane layer 20' with the x and y layers 18X and 18Y of EC lines in the x and y directions shown below layer 20'. Next, the layer 19 of the x and y connection lines which were provided for original connections between C-4 pads and their vias is below layers 18X and 18Y. The lowest layer of the carrier 9 is a power plane layer 20 which supports the layer 19. Secured to the bottom surface of the carrier is an array of hundreds of connection pins 110, which are adapted to provide signal and power voltages to the chip carrier 9.

Alternatively, the x-1 to x-n and y-1 to y-n lines in layers 19 can be combined with the engineering change lines in layers 18X and 18Y shown in FIGS. 1.1, 1.2, and 3. Thus the engineering change lines alternate with the interconnection lines in the same wiring place. The ratio of the engineering change lines to the interconnection lines used is a matter of choice.

FIG. 4 shows chips 11 and 15 on carrier 9 with the wiring illustrated as in FIG. 1.2. In this case, originally, fan-out pad 120 of chip 11 was connected to fan-out pad 115 of chip 15. It has been determined that the proper change is to connect the pad 120 to pad 139 of chip 15. The first step is to disconnect the original connections. Thus, the bridge connections 105 and 114 of pad 120 to pad 106 and pad 115 to pad 109 are severed by means of laser deletion or the like. Deletion can be performed manually as well. In detail, then lines are cut which disconnect the original circuit from via 107 down to x and y connection layers 19 where the upper X-2 line extends to the right where it is connected by means of via 250 down to line Y-32 which connects by means of via 108 up to pad 109. The new connection is by jumper or fly-wire 121 which connects from pad 120 to pad 122 of a dumbbell-shaped link 122-123-124. Pad 122 is connected by means of via 126 down to engineering change line ECX-3 in layer 18X which extends to via 127 which connects up to pad 128 of a dumbbell-shaped link 128-251-129. Link bridge 251 is cut by laser deletion or the like and via 130 to the extension of ECX-3 is cut off (as is via 125 from pad 124). A jumper or fly-wire 131 extends from pad 128 to pad 132 of another dumbbell-shaped link 132-133-134 which connects by via 252 from pad 132 down to engineering change line ECY-30 in layer 18Y to via 253 which connects to pad 135 of link 135-136-137. Note that bridges 133 and 136 are cut by laser deletion to disconnect the extraneous sections of line ECY-30. Pad 135 is connected by fly-wire or jumper wire 138 to pad 139 of chip 15. Pad 141 is disconnected from pad 139 by laser deletion of a portion of bridge connection 140. It is believed that the features of this invention are further illustrated by the above description of FIG. 4.

Figure 5:
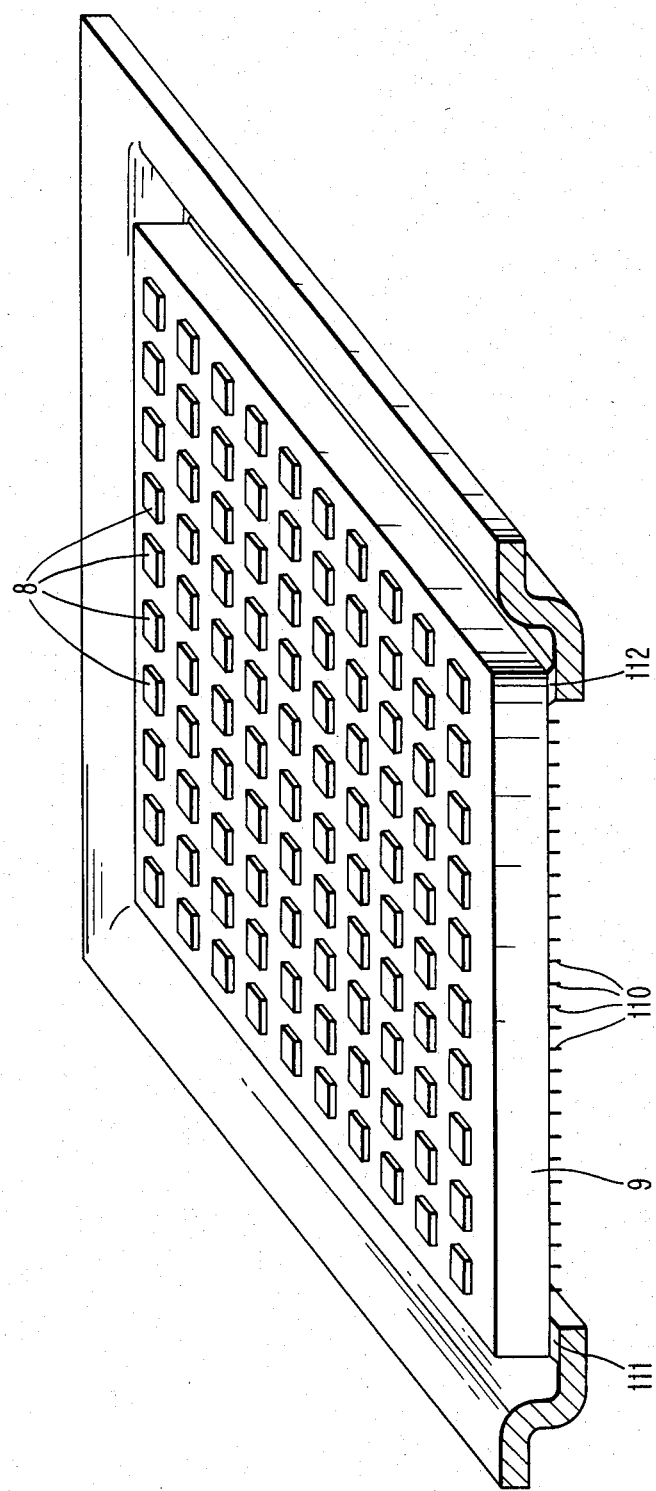
FIG. 5 shows an array of chips on the carrier 9 which is carried upon a support by means of a braze. Pins are shown on the lower surface for connection to a board carrying the chip carrier.

FIG. 5 shows a perspective view of a chip carrier 9 supported upon a frame 111 by means of a bond 112. The chip carrier 9 supports an array of chips 8, in this case one hundred chips. Pins 110 are secured to the lower surface of carrier 9 for the purpose of plugging into a large plurality of sockets in a board which supports the chip carrier 9 and supplies electrical power and signals to the carrier and receives signals from the carrier.

Figure 6:
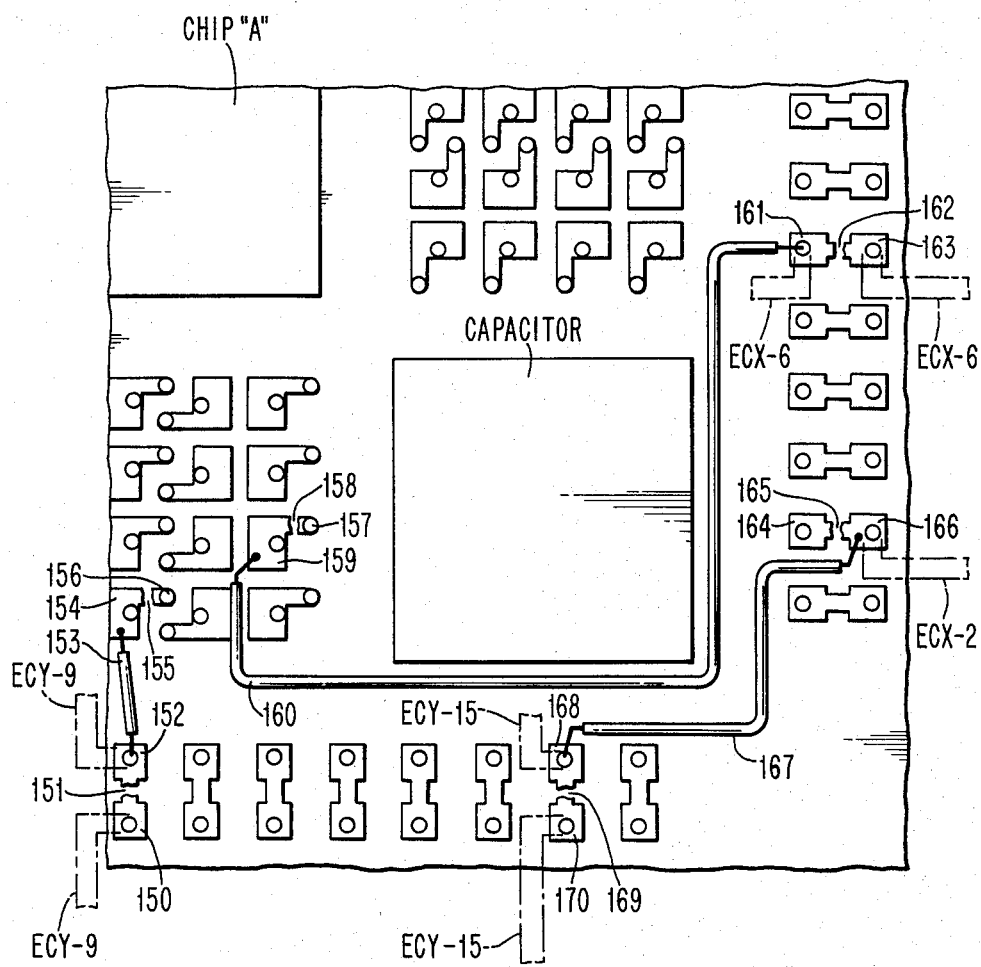
FIG. 6 shows a segment of the upper surface of the chip carrier of FIG. 1.1 shown in considerable detail with three types of connections illustrated.

FIG. 6 illustrates a small portion of the carrier of FIGS. 2.1–2.6 with a quadrant of the area about one chip shown in some detail. Here there are illustrated three types of connections of jumper or fly-wires known as Type 1, 2 and 3 connections. An example of a Type 1 connection, is shown by jumper wire 153 from pad 154, which is a fan-out pad, to pad 152 which is connected to ECY-9 which is a Y direct EC wire in layer 18Y. Pad 154 has been cut by laser deletion at bridge 155 to disconnect via 156 from an x or y directed line in the plane of x, y pairs of connectors in layer 19 in FIGS. 1.1 and 3. Pad 152 has been cut from pad 150 by laser deletion of bridge 151 of the dumbbell-shaped link 150-151-152 of engineering change line ECY-9.

The Type 2 connection is illustrated by connection from pad 159 through fly-wire 160 to pad 161. Pad 159 is a fan-out pad which is severed from its via 157 (to layer 19) by laser deletion of bridge 158. Dumbbell-shaped link 161-162-163 is connected to engineering change line ECX-6 in layer 18X. Bridge 162 is severed by laser deletion.

The Type 3 connection is illustrated by the connection with jumper 167 of pad 168 of dumbbell-shaped link 168-169-170 to pad 166 of dumbbell-shaped link 164-165-166. Bridges 165 and 169 are cut by laser deletion. The pads 164 and 166 are connected to EC wire ECX-2 in layer 18X and the pads 168 and 170 are connected to segments of engineering change line ECY-15 in layer 18Y.

Thus, there is a right angle turn in the direction of the engineering change line afforded by means of the Type 3 connection. The Type 1 connection is from a side of one chip in a column to another chip in the same column along the x or y direction. A Type 2 connection involves going from the x or y side of a chip to the y or x (opposite) side of another chip.

In order to provide an EC connection from one Y side of a chip to the Y side of another chip in the same column one merely jumps wires from the EC pads to be connected to the appropriate dumbbell pads as shown in FIG. 6 (Type 1 connections). The dumbbells are then separated from each other by deleting the connecting strap. Two jumper wires or fly-wires are necessary.

The connection from a Y side of a chip to the X side of a second chip in the same row of chips represents the next simplest connection. In this case a wire is jumped from the EC pad of the Y side of the chip to the dumbbell pad of an X-directed EC wire (Type 2 connection). The other side of the X directed wire is connected by a Type 1 connection to the appropriate EC pad. As above, the dumbbell straps are deleted.

The most complicated connection envisaged is one in which the X-side of a chip is to be connected to the Y-side of another chip and the chips are not located in the same row or column. In this case the completed EC wire is made by a combination of jumper wires described above in addition to a right angle jumper wire (Type 3 connection) shown in FIG. 6. Only three jumper wires and the corresponding deletions are necessary to make this EC connection and all jumper wires are shorter than a chip pitch.

In effect, then, a simple EC scheme is described which should enable up to 24 X and 24 Y wires crossing each other per chip pitch of ~11 mm or a total of 480 X- and Y- EC wires for a chip carrier 9. This result assumes a via grid of 18 mils in the carrier. Since the bulk of the length of a given EC wire is buried inside the substrate in a controlled environment, the amount of electrical coupling to adjacent lines is therefore small. Furthermore, for the same amount of total EC wires needed, the top surface wires for this new approach is much less congested than the conventional discrete EC wiring scheme and hence they can be placed and separated in a discretionary manner to further minimize the amount of coupling.

Impact of EC Plane Pair on Module

Introducing integrated EC wiring in a multilayer ceramic carrier requires the addition of an EC plane pair or two signal layers and a reference plane. It also increases the number of vias which have to be punched in the dielectric layers above the EC plane pair.

EC Demand for Future High Performance Modules

To project the number of wires needed for high performance modules, we have used EC wire statistics for a 100 chip module A. It is known that the average number of EC wires needed per module is 558 and in the worst case is 1144. Assuming that the EC demand will increase linearly with the total number of signal I/O's per module, one can estimate the EC demand for a future module ($N_2$) from the present demand ($N_1$) by $$N_2 = N_1 \cdot \left( \frac{n_2}{n_1} \right)$$

where $n_2$ and $n_1$ are the total number of signal I/O's per module. This was calculated for both the average and worst case EC wiring demand and is shown in Table I.

TABLE I
PROJECTED EC WIRING DEMAND FOR FUTURE MODULES

| Module | No. of Chips Per Module | No. of Signal I/O's Per Chip | Total No. of Signal I/O's Per Module | EC DEMAND # of Wires Average | Maximum |
|---|---|---|---|---|---|
| A | 100 | 96 | 9.60K | 558* | 1144* |
| B | 64 | 188 | 12.03K | ~700 | ~1430 |
| C | 100 | 289 | 28.90K | ~1680 | ~3440 |

*Actual numbers for module A

Wiring Capacity With Buried EC Lines

The number of connections (defined as one completed EC connection between two EC pads) that can be made by using buried wiring is estimated in the following manner. Knowing the total wiring length available, the number of connections made is given by $$N = \frac{UC}{FT} \quad (1)$$

Where,
C = total available wiring length.
U = utilization factor, empirically found to depend on the number of signal I/O's per chip.
F = Average connection length in chip pitch units.
T = chip pitch.
C can be further expressed as, $$C = AN_lS \quad (2)$$

$$= (mT)^2 \cdot \frac{N_p}{mT} \cdot S$$

-continued $$= mTN_t$$

Where,
A = area of the module.
A = $(mT)^2$ for a square module with (m x m) array of chips.
$N_l$ = number of wiring channels per unit length = $N_p/mT$.
S = number of wiring planes.
$N_p$ = number of wiring channels in a wiring plane.
$N_t$ = total number of wiring channels in the module.

From (1) and (2), $$N = \frac{UmN_t}{F} \quad (3)$$

In Table II, using equation (3), we have calculated the number of integrated EC wires for three substrates. F has been taken as 3, from EC wiring statistics.

TABLE II

PROJECTIONS FOR WIRING CAPACITY USING BURIED EC LINES FOR DIFFERENT MULTICHIP MODULES.

| Module | No. of Chips (m × m) | Total No. Of X and Y Buried EC Lines ($N_t$) | Utilization Factor (U) | Total No. of EC Wires (N) |
|---|---|---|---|---|
| A | 10 × 10 | 2 × 170 = 340 | 0.50 | 567 |
| B | 8 × 8 | 2 × 200 = 400 | 0.47 | 501 |
| C | 10 × 10 | 2 × 280 = 560 | 0.44 | 821 |

It is seen that the numbers for modules B and C are similar to the average number of EC wires used for module A and are quite high. Consequently, for modules B and C the total EC demand as projected in Table II can be handled by going through 3 and 5 artwork changes respectively. This again is quite reasonable from the present experience. Using a simulation shows that with an EC plane pair wiring capability of 17-X and 17-Y lines per chip pitch or a total of 2×170=340 EC lines for the 100 chip module and following the same wiring sequence as in an actual module and using the buried EC lines and discrete wires to make a complete EC wire, it was found that, (i) 574 EC connections could be made before any wiring channel was used up.
(ii) On the average, 2.3 discrete wires were needed to complete one EC connection.

It is clear from this work, that the actual number of EC connections made is remarkably close to the number projected from the wiring rule and Table II. This provides confidence that the projections made for modules B and C are likely to be quite good estimates of the number of EC connections that can be made on the modules using the buried EC lines.

SUMMARY

A new and readily implementable EC scheme which utilizes present tools and wires is described for high performance multichip modules. The method accomplishes low noise EC with the use of only short (<1 cm) discrete wires as surface jumper connections. The main sections of the EC wire are controlled impedance lines buried within the module. It is demonstrated that one plane pair of EC wires in a Multilayered Ceramic (MLC) module is capable of providing EC wiring capability at levels demanded by module technology.

Crowding at certain areas of the module is avoided since most wires crossing intersections are buried within the substrate. There is also considerable flexibility in routing a wire between two EC pads.

In summary, it is demonstrated that this EC scheme can satisfy the requirements of high performance modules in the foreseeable future.

A support for multicircuit, electronic, semiconductor chips, known as a module carries chips on areas upon the top of the module both mechanically and electrically connected to the pads. Electrical fan-out conductors extend from the pads for connection to a matrix of signal conductors adapted for carrying signals. The signal conductors are buried below the surface of the module. Power distribution conductors are also buried below the surface of the module. Vertical conductor members known as vias connect from the fan-out conductors to the x and y signal lines and to the power conductors. Engineering change metallization is provided upon the outside surface of said module on the periphery of the chip test, connected to the pads as chosen by means of fly-wires. The improvements comprise forming an array of x and y engineering change lines below the surface of the module with segmentation vias extending up to laser beam severable strips (very short) on the surface so that fly-wires and the strips which are short are the only engineering change metallurgy upon the upper surface of the module. Thus, the engineering change segments along a given line resemble a series of interconnected U-shaped members (formed by the vias and the dotted EC wires below). The severable strips are shown as having dumbbell-shapes with one severed at the thin waist of the dumbbell. In the past, all of the engineering change wires were upon the surface.

The array of engineering change wires is designed in such a way that along a set of x and y lines in the engineering change level beneath the surface of the module there are several substantially uniformly spaced periodic breaks in each x line and each y line with vias extending up from opposite sides of each break to one of the dumbbell-shaped bridging connectors so that by judicious selection of the bridging connectors which are retained and those which are severed by means of a laser beam, a reduction from the 3000 x and y wires required with the design for a typical computer chip today, 200 x wires and 200 y wires are required for a total of 400 wires on the engineering change level. Overall with this design it has been found that 500 to 700 connections can be made employing this design for engineering changes.

Having thus described our invention, what we claim as new, and desire to secure by Letters Patent is:

1. In a module for an array of integrated circuit chips, said module comprising a matrix of insulating material having an upper surface with a set of pads for connection of chips thereto with metallization beneath the surface for standard connections between pads connected to said chips, and fan-out chips, and fan-out metallization with fan-out pads surrounding the mounting area of each chip, said chips being arranged upon said module in a substantially orthogonal pattern upon said upper surface with engineering change pads deposited upon said upper surface adjacent to said fan-out areas, with parallel an orthogonal engineering change lines, the improvement comprising embedding of said engineering change lines aligned within said matrix of said module beneath said upper surface with each of said engineering change lines in a predetermined orientation including a plurality of periodically spaced breaks along the length thereof with connection vias extending upwardly to said surface in parallel from the ends of each of said breaks to an engineering change pad in the form of a link, whereby each of said links can be connected to one of said fan-out pads by means of fly-wires with all of said fly wires being shorter than a chip pitch and said link can be severed into two separate segments to provide a flexible wiring system with minimal inductive coupling, and minimal crossovers in the module employed for engineering change purposes.

2. In a module for an array of integrated circuit chips, said module comprising a matrix of insulating material having an upper surface with a set of pads for connection of chips thereto with metallization beneath the surface for standard connections between pads connected to said chips, and fan-out chips, and fan-out metallization with fan-out pads surrounding the mounting area of each chip, said chips being arranged upon said module in a substantially orthogonal pattern upon said upper surface with engineering change pads deposited upon said upper surface adjacent to said fan-out areas, with parallel an orthogonal engineering change lines, the improvement comprising embedding of said engineering change lines aligned within said matrix of said module beneath said upper surface with each of said engineering change lines in a predetermined orientation including a plurality of periodically spaced breaks along the length thereof with connection vias extending upwardly to said surface in parallel from the ends of each of said breaks to an engineering change pad in the form of a link, whereby each of said links can be connected to one of said fan-out pads by means of fly-wires and said link can be severed into two separate segments to provide a flexible wiring system with minimal inductive coupling, and minimal crossovers in the module employed for engineering change purposes, connections being provided between an engineering change line in the x direction and an engineering change line in the y direction by means of a fly-wire, said fly-wire being short relative to said engineering change lines and on the order of less than one centimeter in length.

3. In a module for an array of integrated circuit chips, said module comprising a matrix of insulating material having an upper surface with a set of pads for connection of chips thereto with metallization beneath the surface for standard connections between pads connected to said chips, and fan-out chips, and fan-out metallization with fan-out pads surrounding the mounting area of each chip, said chips being arranged upon said module in a substantially orthogonal pattern upon said upper surface with engineering change pads deposited upon said upper surface adjacent to said fan-out areas, with parallel an orthogonal engineering change lines, the improvement comprising embedding of said engineering change lines aligned within said matrix of said module beneath said upper surface with each of said engineering change lines in a predetermined orientation including a plurality of periodically spaced breaks along the length thereof with connection vias extending upwardly to said surface in parallel from the ends of each of said breaks to an engineering change pad in the form of a link, whereby each of said links can be connected to one of said fan-out pads by means of fly-wires and said link can be severed into two separate segments to provide a flexible wiring system with minimal inductive coupling, and minimal crossovers in the module employed for engineering change purposes, connections being provided between an engineering change line in the x direction and an engineering change line in the y direction by means of a fly-wire, said fly-wire being short relative to said engineering change lines and on the order of less than one centimeter in length, connections being provided between a pair of chips on said module by means of engineering change lines and fan-out connections in a network formed by interconnection of an engineering change line in the x direction with an engineering change line in the y direction y means of a fly-wire plus interconnection of the ends of the combined x and y engineering change interconnections to fan-out pads for the chips with an additional one of said short fly-wires connected between the corresponding pads, since the x and y engineering change lines within the module are not connected to any chip at the time the module is fabricated whereby total flexibility is achieved by selecting which of said x or y lines will be connected to any particular chip by means of said short fly-wires.

4. A module for supporting electrical components including a plurality of chips on the surface of said module, a plurality of engineering change conductor lines buried within said module, said lines having relatively long lengths, and being buried in a dielectric material providing a characteristic impedance which minimizes reflections because of the matched characteristic impedance, said engineering change lines extending in at least two directions at corresponding levels within said module crossing over each other without intersecting, each of said engineering change lines including a plurality of sets of interruptions with a set of vias extending up to the top surface of said module adjacent to one of said chips at each of said vias, and a plurality of spaced very short bridging connectors providing link connections connecting each of said sets of vias on said top surface of said module, with fly-wires which are relatively short, on the order of less than 1 cm long, connected between adjacent pairs of said link connections, and said link connections connected to said fly-wires being severed to form an interconnection between any two sets of link connections down to the connected engineering change lines and up to adjacent link connections for use in making engineering change connections between such points to connect said chips together comprising an engineering change on said module added subsequent to manufacture of said module.

5. A module in accordance with claim 4 wherein a plurality of chips and fan-out connections with associated fan-out pads are located on and just beneath said top surface respectively, with a plurality of said link connections surrounding said chips whereby said fan-out pads are adapted to be connected to said links with fly-wires.

6. A module in accordance with claim 5 wherein a first chip is connected to a second chip by means of interconnections between the fan-out pads where an X directed one of said engineering change lines is connected to the first of said chips by one of its fan-out pads connected with a fly-wire to a first one of said links of said X directed one of said engineering change lines, with the extraneous end of said X directed engineering change line cut by severing of said link to break a bridge formed therein between said vias associated therewith, a Y directed one of said engineering change lines having its link adjacent to said second chip appropriately severed and connected to the appropriate fan-out pad thereof by means of another fly-wire, and a pair of appropriately severed links of said X directed line and said Y directed line located immediately adjacent each other being connected by a third fly-wire, whereby said chips are electrically interconnected.

* * * * *